United States Patent
Chang et al.

(10) Patent No.: US 10,194,530 B2
(45) Date of Patent: *Jan. 29, 2019

(54) MICROELECTRONIC SYSTEM INCLUDING PRINTED CIRCUIT BOARD HAVING IMPROVED POWER/GROUND BALL PAD ARRAY

(71) Applicant: MEDIATEK INC., Hsin-Chu (TW)

(72) Inventors: Sheng-Ming Chang, New Taipei (TW); Chia-Hui Liu, Taichung (TW); Shih-Chieh Lin, Taipei (TW); Chun-Ping Chen, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/847,852

(22) Filed: Dec. 19, 2017

(65) Prior Publication Data
US 2018/0116051 A1   Apr. 26, 2018

Related U.S. Application Data

(63) Continuation of application No. 15/431,781, filed on Feb. 14, 2017, now Pat. No. 9,883,591, which is a
(Continued)

(51) Int. Cl.
*H05K 1/11* (2006.01)
*H05K 1/02* (2006.01)
(Continued)

(52) U.S. Cl.
CPC ........ *H05K 1/115* (2013.01); *H01L 23/49816* (2013.01); *H01L 23/49822* (2013.01);
(Continued)

(58) Field of Classification Search
CPC ...... H05K 1/111; H05K 1/0298; H05K 1/115; H05K 1/0262; H05K 2201/10734
(Continued)

(56) References Cited

U.S. PATENT DOCUMENTS 5,371,407 A * 12/1994 Goldman ............ H01L 21/4803
257/675
6,198,635 B1   3/2001 Shenoy
(Continued)

FOREIGN PATENT DOCUMENTS

CN   101801154 A   8/2010
TW   348366         12/1998
(Continued)

*Primary Examiner* — Timothy Thompson
*Assistant Examiner* — Charles Pizzuto
(74) *Attorney, Agent, or Firm* — Winston Hsu

(57) ABSTRACT

A microelectronic system includes a base and a semiconductor package mounted on the base. The base includes an internal conductive layer and a build-up layer on the internal conductive layer. The build-up layer includes a top conductive layer. A plurality of microvias is disposed in the build-up layer to electrically connect the top conductive layer with the internal conductive layer. A power/ground ball pad array is disposed in the top conductive layer. The power/ground ball pad array includes power ball pads and ground ball pads arranged in an array with a fixed ball pad pitch P, and the power/ground ball pad array includes a 4-ball pad unit area comprised of only one ground ball pad and three power ball pads, or comprised of only one power ball pad and three ground ball pads. The 4-ball pad unit area has a rectangular shape and a dimension of about 2P×2P.

22 Claims, 7 Drawing Sheets

Related U.S. Application Data continuation of application No. 14/860,718, filed on Sep. 22, 2015, now Pat. No. 9,609,749.

(60) Provisional application No. 62/080,019, filed on Nov. 14, 2014.

(51) Int. Cl.
    *H01L 23/498* (2006.01)
    *H01L 23/50* (2006.01)
    *H01L 23/00* (2006.01)
    *H05K 1/05* (2006.01)
    *H05K 1/18* (2006.01)

(52) U.S. Cl.
    CPC ........ *H01L 23/49827* (2013.01); *H01L 23/50* (2013.01); *H01L 24/16* (2013.01); *H05K 1/0262* (2013.01); *H05K 1/0298* (2013.01); *H05K 1/05* (2013.01); *H05K 1/111* (2013.01); *H05K 1/114* (2013.01); *H05K 1/181* (2013.01); *H01L 23/49838* (2013.01); *H01L 2224/16225* (2013.01); *H01L 2224/32225* (2013.01); *H01L 2224/73204* (2013.01); *H01L 2924/15311* (2013.01); *H01L 2924/181* (2013.01); *H05K 2201/095* (2013.01); *H05K 2201/09227* (2013.01); *H05K 2201/09509* (2013.01); *H05K 2201/10378* (2013.01); *H05K 2201/10674* (2013.01); *H05K 2201/10734* (2013.01)

(58) Field of Classification Search
    USPC ........................................ 174/262
    See application file for complete search history.

(56) References Cited

U.S. PATENT DOCUMENTS

| | | | |
|---|---|---|---|
| 7,888,803 B2 | 2/2011 | Kariya | |
| 8,119,931 B1 | 2/2012 | Liu | |
| 8,284,564 B2 | 10/2012 | Mizuno | |
| 8,872,350 B2 | 10/2014 | Sawachi | |
| 2001/0035746 A1* | 11/2001 | Burstein | H01L 23/5386 323/283 |
| 2002/0084107 A1* | 7/2002 | Chang | H01L 23/49838 174/262 |
| 2003/0045083 A1 | 3/2003 | Towle | |
| 2004/0183213 A1 | 9/2004 | Hsu | |
| 2004/0227163 A1 | 11/2004 | Sakamoto | |
| 2005/0098882 A1* | 5/2005 | Kusagaya | H05K 3/4602 257/734 |
| 2009/0188707 A1* | 7/2009 | van den Hoek | H05K 3/4038 174/257 |
| 2010/0202123 A1 | 8/2010 | Mizuno | |
| 2011/0019379 A1 | 1/2011 | Shibuya | |
| 2014/0116765 A1 | 5/2014 | Hossain | |
| 2014/0334121 A1 | 11/2014 | Ito | |
| 2015/0054159 A1* | 2/2015 | Hoegerl | H01L 23/3735 257/762 |
| 2015/0083602 A1 | 3/2015 | Nichols | |
| 2015/0124419 A1 | 5/2015 | Wong | |
| 2015/0187966 A1* | 7/2015 | Asthana | H01L 31/02245 438/64 |

FOREIGN PATENT DOCUMENTS

| | | |
|---|---|---|
| TW | 200616505 | 5/2006 |
| TW | 200806107 | 1/2008 |

\* cited by examiner

MICROELECTRONIC SYSTEM INCLUDING PRINTED CIRCUIT BOARD HAVING IMPROVED POWER/GROUND BALL PAD ARRAY

CROSS REFERENCE TO RELATED APPLICATION

This application is a continuation of U.S. application Ser. No. 15/431,781 filed Feb. 14, 2017, which itself is a continuation of U.S. application Ser. No. 14/860,718 filed Sep. 22, 2015. U.S. application Ser. No. 14/860,718 claims the benefit of U.S. provisional application No. 62/080,019 filed Nov. 14, 2014. The above-mentioned applications are included in their entirety herein by reference.

BACKGROUND

The present invention relates to semiconductor technology fields. More particularly, the present invention relates to a microelectronic system involving an improved power/ground ball pad array on a printed circuit board (PCB) that is capable of reducing board-level IR drop.

An integrated circuit (IC) device typically includes an IC chip that is housed in a package. The IC chip typically includes a circuit fabricated by lithographically patterning conductive and insulating materials on a thin wafer of semiconductor using known fabrication techniques. The package supports and protects the IC chip and provides electrical connections between the circuit and an external circuit board. Several known package types are used to house IC chips, such as ball grid arrays (BGAs), pin grid arrays (PGAs), plastic leaded chip carriers, plastic quad flat packs and others, for example.

A ball grid array (BGA) package for higher performance applications is known in the art. A BGA package is typically joined to a mounting board by use of conductive balls (bumps) arranged in an array on its back as external terminals, instead of using a lead frame. Because the entire back surface of the semiconductor package can be used for connection to the board, the number of input/output pads can be markedly increased. To support higher functionality, the number of pins has remarkably increased.

As system complexity and operational speeds increase, the power consumption of integrated circuits increases dramatically. Additionally, the IC supply voltage continues to drop with the inevitable scaling of VLSI technology. Reducing the nominal supply voltage is accompanied by a reduction in device noise margins, making components more vulnerable to power supply noise. This noise consists of the dynamic AC voltage fluctuation due to the frequency dependent distributed parasitics inherent in today's power distribution systems, and the DC voltage drop (i.e., "IR" drop).

In a microelectronic system, the system's IR drop may be budgeted into three portions: on-chip, package and board. On-chip IR drop has been extensively studied because the resistive loss is severe due to the fine feature-size of the on-die power grid. On the other hand, package and board-level IR drop have not been given much attention. Due to increased current requirements and reduced supply voltage noise margins, package and board IR drop now can have a significant impact on the operation of high-speed devices.

Several factors contribute to increased off-chip path resistances. In multilayer IC packages such as BGAs, for example, the power distribution usually traverses multiple layers from the balls to the chip connect bumps. These paths are much shorter than those on the board; however, package power and ground planes usually require much more irregular shapes to accommodate the chip I/O breakout and usually are not allowed to fill an entire plane. Many packages also contain a number of power domains, but a very limited number of layers are available for their distribution.

Therefore, it is common for power distributions to contain complex shapes and other non-ideal routing. Printed circuit boards have their own share of issues as well. In large and complex PCBs, the power distribution system may have to traverse several feet of planes and traces to reach the far-end devices. Therefore, far-end devices will see a larger voltage drop. Because of the long distribution paths, it is possible for designs to deliver insufficient voltage to some devices. Therefore, for high-current and low-voltage designs, it is becoming critically important to include package and board IR drop into the total noise budget of the system.

SUMMARY

It is an objective of the claimed invention to provide a microelectronic system involving an improved printed circuit board (PCB) having a novel power/ground ball pad array that is capable of reducing board-level IR drop.

According to one aspect of the invention, a microelectronic system includes a base and a semiconductor package mounted on the base. The base includes an internal conductive layer and a build-up layer on the internal conductive layer. The build-up layer comprises a top conductive layer. A plurality of microvias is disposed in the build-up layer to electrically connect the top conductive layer with the internal conductive layer. A power/ground ball pad array is disposed in the top conductive layer. The power/ground ball pad array comprises power ball pads and ground ball pads arranged in an array with a fixed ball pad pitch P, and the power/ground ball pad array comprises a 4-ball pad unit area comprised of only one ground ball pad and three power ball pads, or comprised of only one power ball pad and three ground ball pads. The 4-ball pad unit area has a rectangular shape and a dimension of about 2P×2P.

According to another aspect of the invention, a microelectronic system includes a base and a semiconductor package mounted on the base. The base includes an internal conductive layer and a build-up layer on the internal conductive layer. The build-up layer comprises a top conductive layer. A plurality of microvias is disposed in the build-up layer to electrically connect the top conductive layer with the internal conductive layer. A power net is disposed in the top conductive layer. The power net comprises a plurality of power ball pads arranged and interconnected in a comb-shaped pattern. A ground net is disposed in close proximity to the power net and coupled to the power net in an interdigitated fashion. The ground net comprises a plurality of ground ball pads arranged and interconnected in an inverted comb-shaped pattern so that said ground net is interdigitated with the power net.

According to still another aspect of the invention, a microelectronic system includes a base and a semiconductor package mounted on the base. The base includes an internal conductive layer and a build-up layer on the internal conductive layer. The build-up layer comprises a top conductive layer. A plurality of microvias is disposed in the build-up layer to electrically connect the top conductive layer with the internal conductive layer. A power net is disposed in the top conductive layer. The power net comprises a plurality of power ball pads arranged in cascade. A ground net is disposed in close proximity to the power net and coupled to the power net in an interdigitated fashion. The ground net comprises a plurality of ground ball pads arranged in cascade.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced. These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

BGA packages such as Flip-chip BGA packages, wire-bond BGA, or Fan-Out WLPs (Fan-Out Wafer Level Packages), continue to evolve in terms of complexity, and on-die voltages continue to decrease with advances in deep sub-micron technology. Because the signals and voltages in package planes are large in comparison to the proximity of the IC components and the package planes, proximity effects take on more and more importance to the operation of the integrated circuit.

A high IR drop results in increased power consumption and reduced signal timing speed. Therefore, there is a need in this industry to provide an improved power/ground ball pad array on a printed circuit board (PCB) that is capable of reducing board-level IR drop in a microelectronic system. The present invention addresses this issue.

Figure 1:
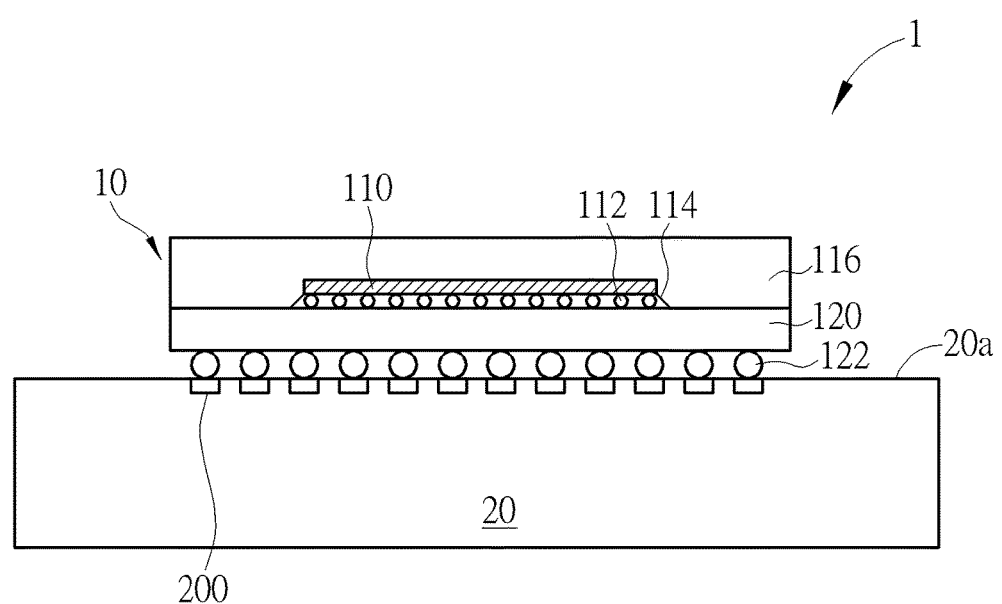
FIG. 1 illustrates a cross-sectional representation of a microelectronic system according to one embodiment of the invention.

FIG. 1 illustrates a cross-sectional representation of a microelectronic system 1 comprising a semiconductor package 10 such as a BGA package mounted on a top surface of a high-density multi-layer printed circuit board (PCB) 20. For example, the semiconductor package 10 may be a flip-chip BGA, but not limited thereto. It is to be understood that other types of BGA packages such as wire-bond BGA, Fan-Out packages, etc. may be employed. According to the illustrative embodiment. for example, the semiconductor package 10 comprises a flip chip 110 mounted on a first side (chip side) of a packaging substrate 120. For example, the flip chip 110 may be a CPU or an SOC (System-On-a-Chip) of a mobile phone platform according to the illustrative embodiment.

It is to be understood that the semiconductor package 10 may further comprise other chips or chip packages to thereby form a System-In-a-Package (SiP), a Package-on-Package (PoP), etc.

Generally, in a flip-chip BGA, the electrically conductive terminals on the inverted "upper" surface of the flip chip 110 are soldered directly to corresponding lands of a die bond area on the surface of the packaging substrate 120 using reflowable solder bumps 112. The semiconductor package 10 is then couple to the PCB 20 using solder bumps or balls 122.

The semiconductor package 10 may further comprise an underfill 114 interposed between the flip chip 110 and the packaging substrate 120. The underfill 114 may be a specially engineered epoxy that fills the gap between the flip chip 110 and the packaging substrate 120, surrounding the bumps 122. It is designed to control the stress in the solder joints caused by the difference in thermal expansion between the flip chip 110 and the packaging substrate 120. Once cured, the underfill 114 absorbs the stress, reducing the strain on the bumps 114, greatly increasing the life of the finished package. It is to be understood that in some cases, the underfill 114 may be omitted. The semiconductor package 10 may further comprise a molding cap 116 that at least encapsulates the flip chip 110 for protection purposes.

The solder balls 122 may comprise an array of power balls and ground balls (not explicitly shown), which are typically disposed in an approximately central area of the bottom surface of the semiconductor package 10. Further, it is understood that multiple power nets and ground nets may be provided. These power balls and ground balls are aligned and joined to corresponding ball pads 200 on the package-mounting surface 20a of the PCB 20.

Figure 2:
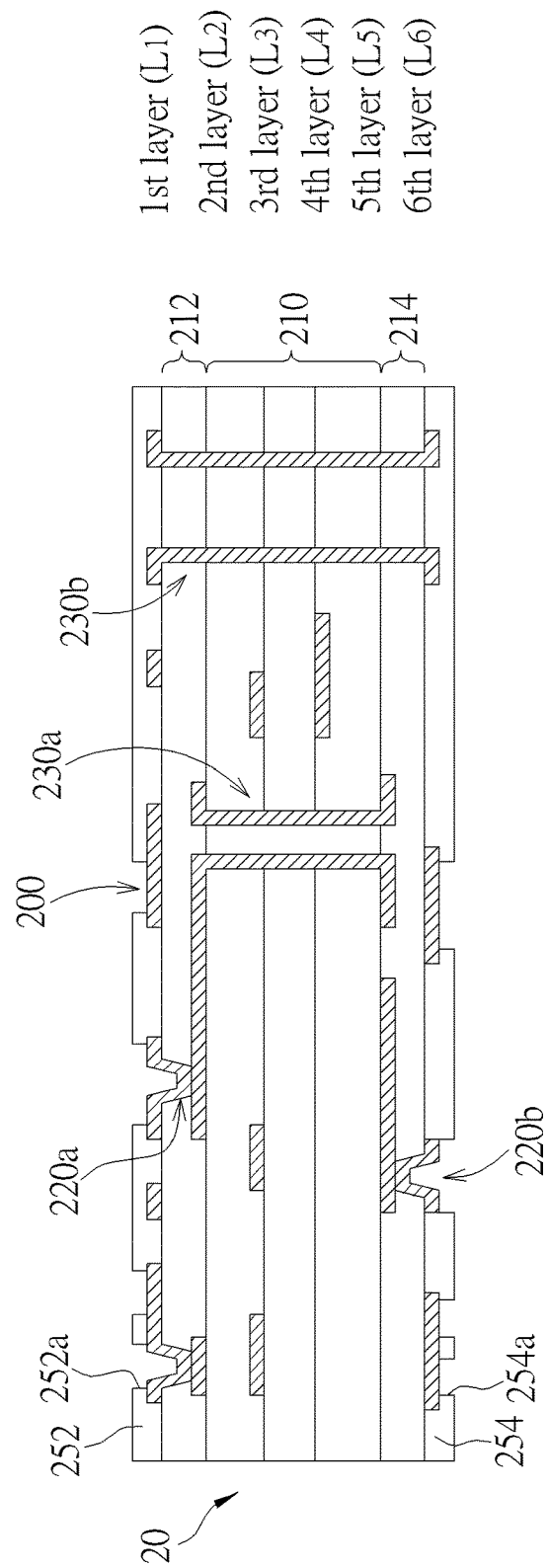
FIG. 2 illustrates an exemplary cross-sectional diagram showing a portion of a high-density multi-layer PCB according to one embodiment of the invention.

FIG. 2 illustrates an exemplary cross-sectional diagram showing a portion of the high-density multi-layer PCB 20. For example, the high-density multi-layer PCB 20 may be a high-density interconnect (HDI) circuit board having 4 to 10 layers, for example, HDI-1, HDI-2, HDI-3, HDI-4, or ELIC (every layer inter-connection) PCB. For illustration purposes only, FIG. 2 depicts a 6-layer (1+4+1) PCB. However, it is understood that the present invention may be applicable to other types of PCBs.

As shown in FIG. 2, the high-density multi-layer PCB 20 comprises a laminated core 210 and build-up layers 212 and 214 sandwiching about the laminated core 210. The build-up layers 212 and 214 may be formed on the laminated core 210 using any resin build-up method and metallization process known in the art. For example, the build-up layers 212 and 214 may comprises BT resin and plated copper layer. A plurality of microvias 220a may be formed in the build-up layer 212 to electrically connect the top conductive layer ($L_1$ or the 1st layer) with the internal conductive layer ($L_2$ or the 2nd layer) of the laminated core 210. A plurality of microvias 220b may be formed in the build-up layer 214 to electrically connect the bottom conductive layer ($L_6$ or the 6th layer) with the internal conductive layer ($L_5$ or the 5th layer) of the laminated core 210. The microvias 220a and 220b may be formed using laser-drilling techniques and may have a via diameter size ranging between 0.05-0.2 mm, for example.

An exemplary buried through via 230a may be provided to penetrate through an entire thickness of the laminated core 210 for interconnection. For example, the buried through via 230a may be filled with epoxy resin. An exemplary plated through hole (PTH) 230b may be provided to penetrate through an entire thickness of the 6-layer PCB for component pins. The buried through via 230a and the PTH 230b may be formed by using mechanical drilling techniques and may have a larger hole diameter ranging between 0.25-0.5 mm, for example. According to the embodiment of the invention, the bottom ($L_6$) conductive layer may be used as a ground plane, but not limited thereto.

Normally, a solder mask 252 may be coated on the build-up layer 212 to protect the top conductive layer ($L_1$) and a solder mask 254 may be coated on the build-up layer 214 to protect the bottom conductive layer ($L_6$). Solder mask openings 252a and 254a may be formed in the solder masks 252 and 254, respectively, to expose the corresponding ball pads 200.

It is to be understood that various PCB standard parameters (e.g. layers, stack-up and via type, etc.) may be employed depending upon design requirements. For example, the PCB standard parameters may comprise a layer count (e.g. 6, 8 or 10 layers), a stack-up setting (e.g. high density interconnect HDI-1 or HDI-2; and a via type: stagger via or stacked via), wherein HDI-1 stands for 1+4+1 6-layer PCB and HDI-2 stands for 1+1+2+1+1 6-layer PCB, for example. Moreover, the PCB standard parameters may comprise a component placement parameter indicating that the components such as capacitors or resistors may be mounted on a single-sided or double-sided PCB.

Figure 3:
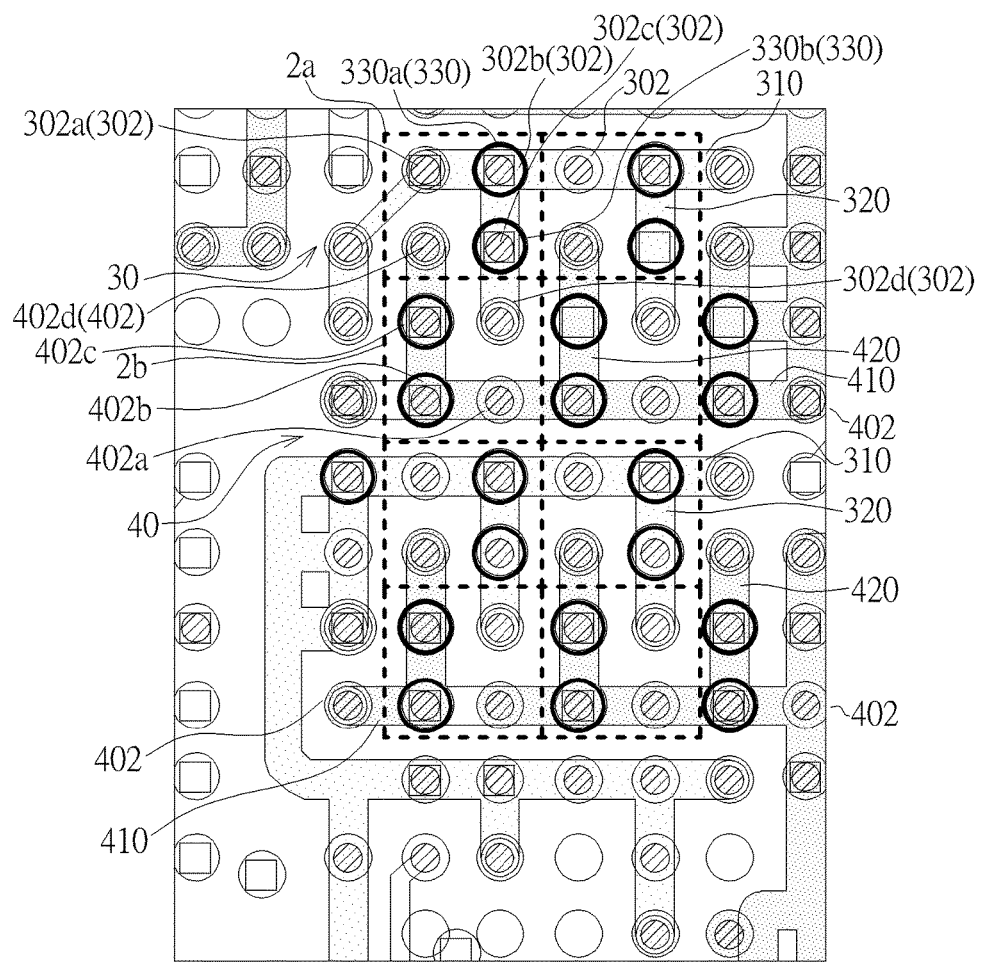
FIG. 3 is a top schematic plan view showing a portion of the power/ground ball pad array in the first layer ($L_1$) of the exemplary high-density multi-layer PCB as depicted in FIG. 2.
Figure 4:
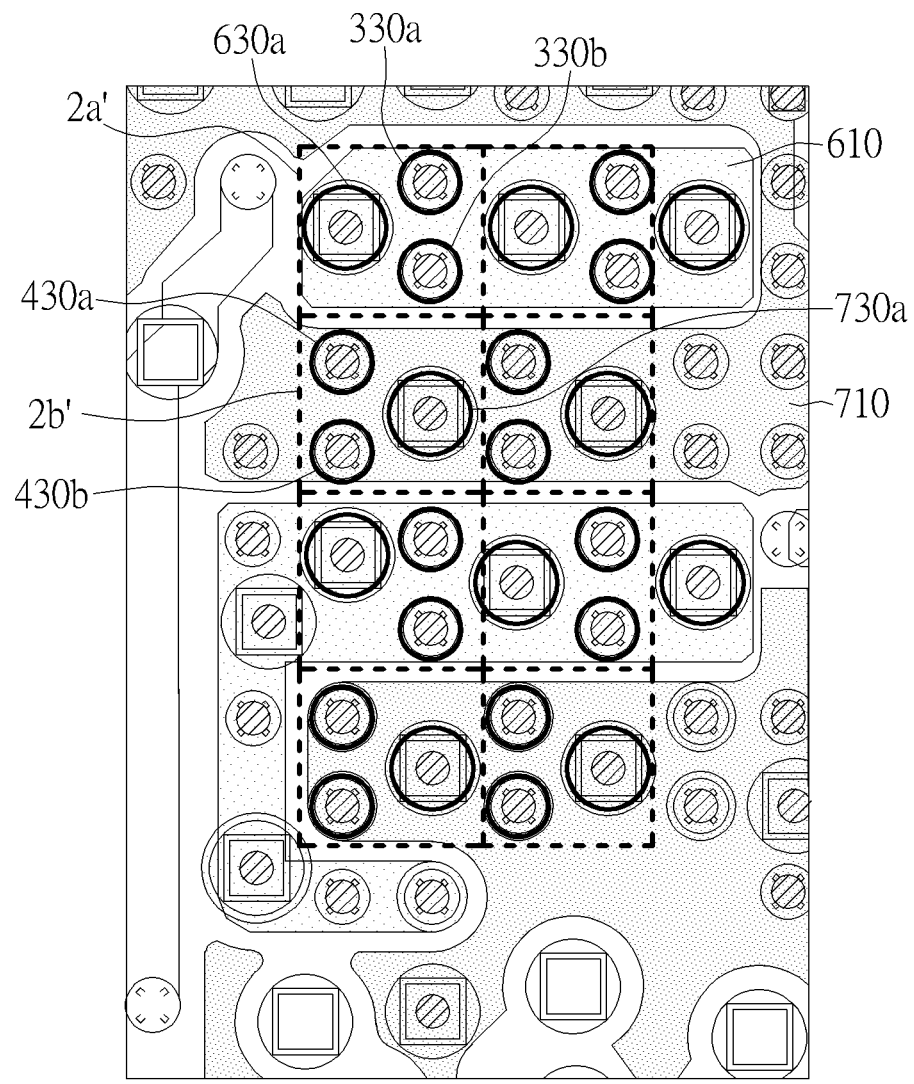
FIG. 4 is a schematic plan view showing a portion of the via arrangement in the second layer ($L_2$) of the exemplary high-density multi-layer PCB, wherein the illustrated area portion in FIG. 3 is approximately aligned with the area portion shown in FIG. 4.

Please refer to FIG. 3 and FIG. 4. FIG. 3 is a top schematic plan view showing a portion of the power/ground ball pad array in the top layer ($L_1$) of the exemplary high-density multi-layer PCB as depicted in FIG. 2. FIG. 4 is a schematic plan view showing a portion of the via arrangement in the second layer ($L_2$) of the exemplary high-density multi-layer PCB, wherein the illustrated area portion in FIG. 3 is approximately aligned with the area portion shown in FIG. 4. According to the illustrative embodiment, the power/ground ball pad array is situated directed under the chip package 10 within a chip package mounting area.

As shown in FIG. 3, a power net 30 and a ground net 40 are provided in the first layer ($L_1$) within the chip package mounting area of the exemplary high-density multi-layer PCB. The power net 30 comprises a plurality of power ball pads 302 arranged and interconnected in a comb-shaped pattern. The power ball pads 302 are interconnected together by power traces 310 and power traces 320. For example, the power traces 310 may extend along a first direction and the power traces 320 may extend along a second direction. The first direction may be perpendicular to the second direction.

The power balls on a chip package (not shown in this figure) may be aligned and joined to corresponding power ball pads 302. According to the illustrative embodiment, four to six power ball pads 302 may be interconnected together along the first direction by a single power trace 310, and each power trace 320 may interconnect three power ball pads, for example, ball pads 302b, 302c, and 302d, along the second direction.

The ground net 40 is disposed in close proximity to the power net 30 and is coupled to the power net 30 in an interdigitated fashion. The ground net 40 comprises a plurality of ground ball pads 402 arranged and interconnected in an inverted comb-shaped pattern so that the comb-shaped ground net 40 is interdigitated with the comb-shaped power net 30. The interdigitated configuration of the power net 30 and ground net 40 is beneficial because such arrangement makes power/ground inductive loop get smaller, and thus smaller AC IR drop.

Likewise, the ground ball pads 402 are interconnected together by ground traces 410 and ground traces 420. The ground traces 410 may extend along the first direction and the ground traces 420 may extend along the second direction. The ground balls on a chip package may be aligned and joined to corresponding ground ball pads 402. According to the illustrative embodiment, four to six ground ball pads 402 may be interconnected together along the first direction by a single ground trace 410, and each ground trace 420 may interconnect three ground ball pads, for example, pads 402b, 402c, and 402d, along the second direction.

According to the illustrative embodiment, the power ball pads 302 and the ground ball pads 402 may be arranged in an array with a fixed ball pad pitch. The ball pad pitch is defined as the distance between two center points of two adjacent ball pads. The ball pad pitch may range between 0.2 mm and 0.6 mm, for example, 0.4 mm, but not limited thereto.

Figure 5:
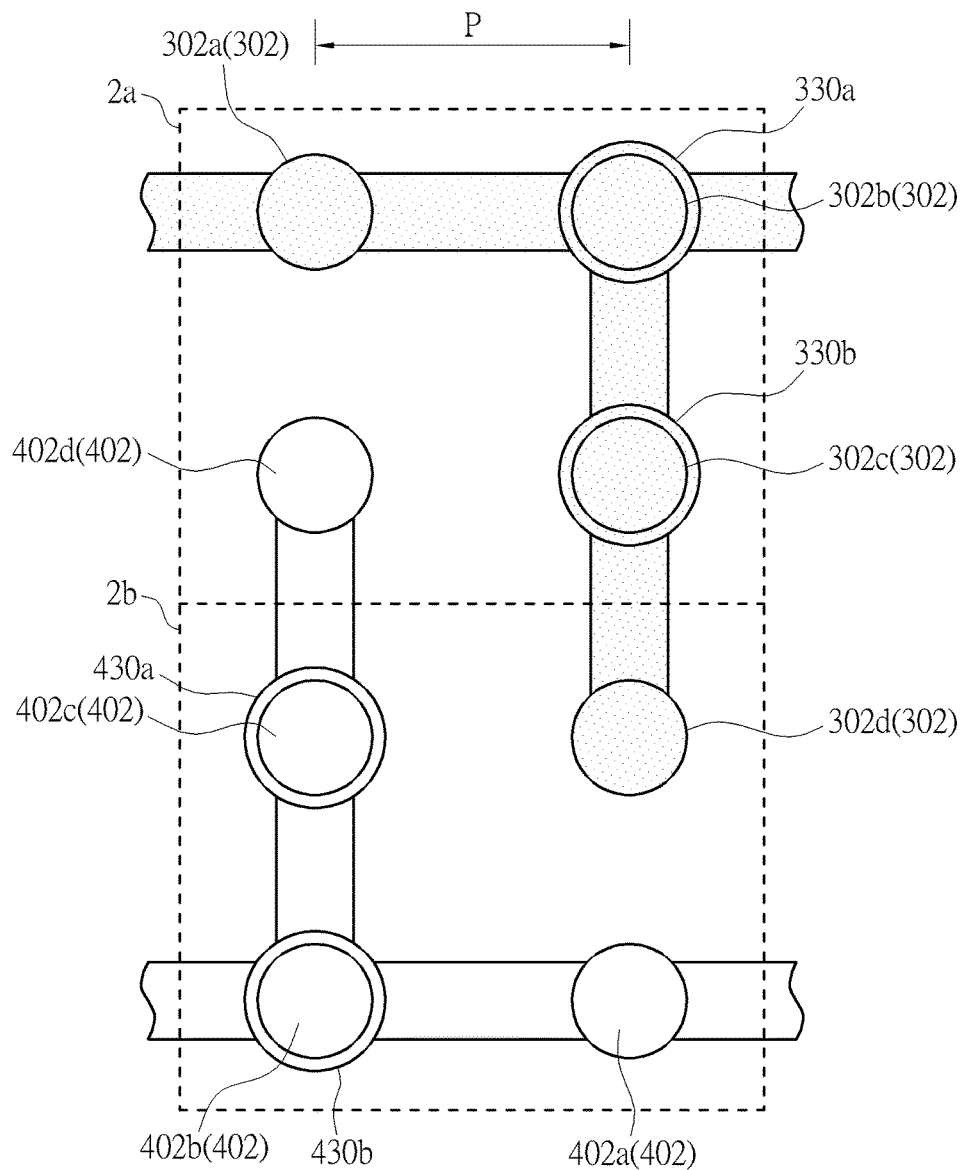
FIG. 5 is an enlarged view showing two adjacent ball pad units of FIG. 3.

In FIG. 3, a 2×4 ball pad unit matrix is indicated by dashed lines. The 2×4 ball pad unit matrix includes a plurality of 4-ball pad unit areas 2a and a plurality of 4-ball pad unit areas 2b. Two adjacent ball pad unit areas 2a and 2b are shown in FIG. 5. According to the illustrative embodiment, each of the 4-ball pad unit areas 2a and 2b has a rectangular shape and a dimension of about 2P×2P, wherein P is the ball pad pitch. According to the illustrative embodiment, each 4-ball pad unit area 2a includes one distal ground ball pad, for example, ground ball pad 402d, and three power ball pads, for example, power ball pads 302a, 302b, and 302c.

In the 4-ball pad unit area 2a, according to the illustrative embodiment, only two of the three power ball pads, for example, power ball pads 302b, and 302c, are interconnected to the underlying power plane 610 through respective laser-drilled microvias 330a and 330b. Please refer briefly to FIG. 4, the region 2a' corresponding to the 4-ball pad unit area 2a in FIG. 3 accommodates only two laser-drilled microvias 330a and 330b and only one mechanically-drilled buried through via 630a that interconnects the power plane 610 in the second layer ($L_2$) with the underlying layers of the exemplary high-density multi-layer PCB.

According to the illustrative embodiment, each 4-ball pad unit area 2b includes one distal power ball pad, for example, power ball pad 302d, and three ground ball pads, for example, ground ball pads 402a, 402b, and 402c. In the 4-ball pad unit area 2b, according to the illustrative embodiment, only two of the three ground ball pads, for example, ground ball pads 402b, and 402c, are interconnected to the underlying ground plane 710 through respective laser-drilled microvias 430a and 430b. Please refer briefly to FIG. 4, the region 2b' corresponding to the 4-ball pad unit area 2b in FIG. 3 accommodates only two laser-drilled microvias 430a and 430b and only one mechanically-drilled buried through via 730a that interconnects the ground plane 710 in the second layer ($L_2$) with the underlying layers of the exemplary high-density multi-layer PCB.

Figure 6:
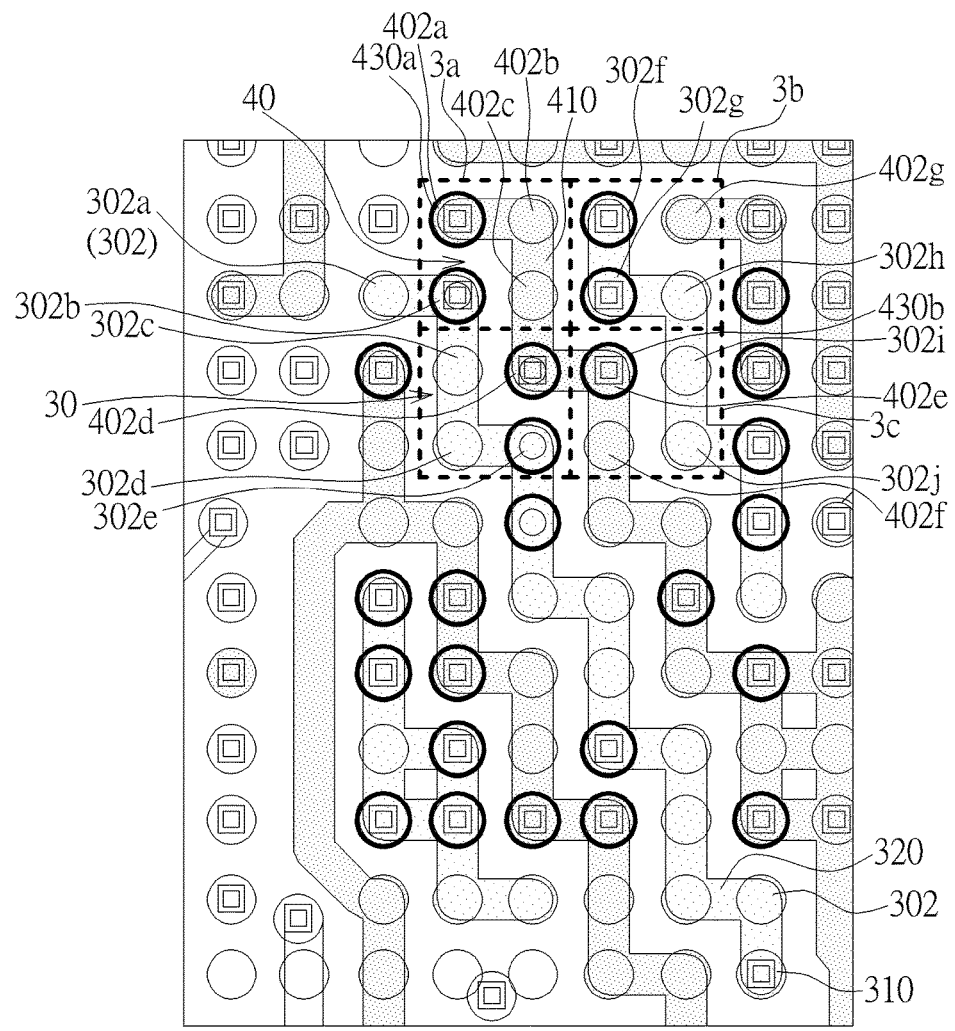
FIG. 6 is a top schematic plan view showing a portion of the power/ground ball pad array in the first layer ($L_1$) of the exemplary high-density multi-layer PCB.
Figure 7:
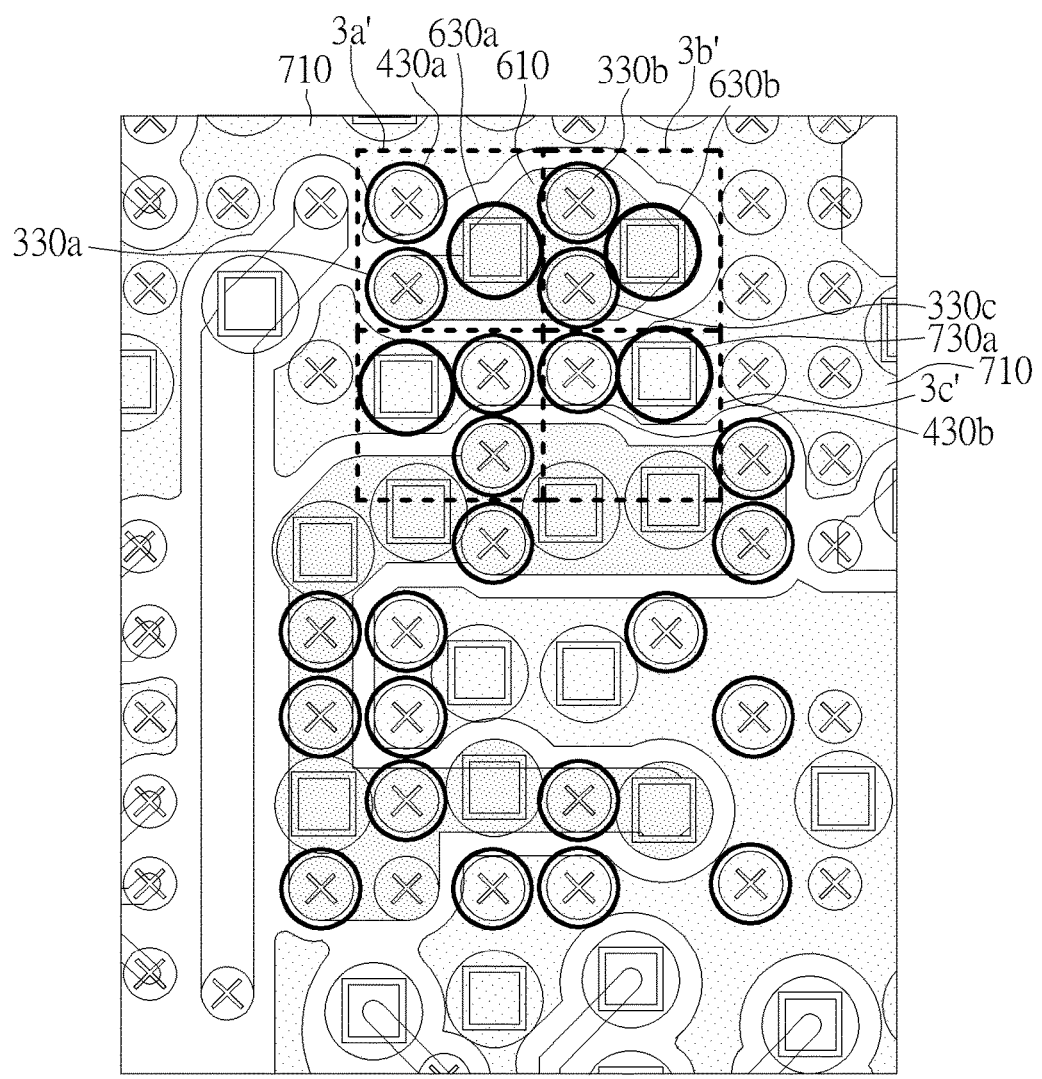
FIG. 7 is a schematic plan view showing a portion of the via arrangement in the second layer ($L_2$) of the exemplary high-density multi-layer PCB, wherein the illustrated area portion in FIG. 6 is approximately aligned with the area portion shown in FIG. 7.

Please refer to FIG. 6 and FIG. 7. FIG. 6 is a top schematic plan view showing a portion of the power/ground ball pad array in the first layer ($L_1$) of the exemplary high-density multi-layer PCB according to another embodiment of the invention, wherein like regions, layers, or elements are designated with like numeral numbers. FIG. 7 is a schematic plan view showing a portion of the via arrangement in the second layer ($L_2$) of the exemplary high-density multi-layer PCB, wherein the illustrated area portion in FIG. 6 is approximately aligned with the area portion shown in FIG. 7. According to the illustrative embodiment, the power/ground ball pad array is situated directed under the chip package 10 within a chip package mounting area.

As shown in FIG. 6, likewise, at least one power net 30 and at least one ground net 40 are provided in the first layer ($L_1$) within the chip package mounting area of the exemplary high-density multi-layer PCB. The power net 30 comprises a plurality of power ball pads 302 arranged and interconnected in cascade in a ladder form. The power ball pads 302 are interconnected together by power traces 310 and power traces 320.

According to the illustrative embodiment, for example, each power trace 310 may extend along a first direction and each power trace 320 may extend along a second direction. The first direction may be perpendicular to the second direction. According to the illustrative embodiment, each power trace 310 may interconnect two to three power ball pads 302, for example, power ball pads 302b, 302c, 302d along the first direction, while each power trace 310 may interconnect two power ball pads 302, for example, power ball pads 302d and 302e along the second direction.

According to the illustrative embodiment, the ground net 40 is disposed in close proximity to the power net 30. The ground net 40 comprises a plurality of ground ball pads 402 arranged and interconnected in cascade in a ladder form. According to the illustrative embodiment, the power net 30 and the ground net 40 are basically arranged in a one-power one-ground (1P1G) interleaving power/ground trace routing configuration.

Likewise, the ground ball pads 402 are interconnected together by ground traces 410 and ground traces 420. The ground traces 410 may extend along the first direction and the ground traces 420 may extend along the second direction. The ground balls on a chip package may be aligned and joined to corresponding ground ball pads 402. According to the illustrative embodiment, three ground ball pads 402, for example, pads 402b, 402c, and 402d, may be interconnected together along the first direction by a single ground trace 410, and each ground trace 420 may interconnect two ground ball pads, for example, pads 402a and 402b, along the second direction.

According to the illustrative embodiment, the power ball pads 302 and the ground ball pads 402 may be arranged in an array with a fixed ball pad pitch. The ball pad pitch is defined as the distance between two center points of two adjacent ball pads. The ball pad pitch may range between 0.2 mm and 0.6 mm, for example, 0.4 mm, but not limited thereto.

In FIG. 6, a 2×2 ball pad unit matrix is indicated by dashed lines. The 2×2 ball pad unit matrix includes a 4-ball pad unit area 3a, a 4-ball pad unit area 3b, and a 4-ball pad unit area 3c. According to the illustrative embodiment, each of the 4-ball pad unit areas 3a~3c has a rectangular shape and a dimension of about 2P×2P, wherein P is the ball pad pitch as previously mentioned. According to the illustrative embodiment, the 2×2 ball pad unit matrix includes sixteen ball pads 302 and 402 including 9 power ball pads 302b~302j and 7 ground ball pads 402a~402g.

According to the illustrative embodiment, each 4-ball pad unit area 3a includes only one power ball pad 302, for example, power ball pad 302b, and three ground ball pads 402, for example, ground ball pads 402a, 402b, and 402c. In the 4-ball pad unit area 3a, according to the illustrative embodiment, only one of the three ground ball pads 402, for example, ground ball pad 402a, is interconnected to the underlying ground plane 710 through the laser-drilled microvia 430a. The power ball pad 302b in the 4-ball pad unit area 3a is interconnected to the underlying power plane 610 through the laser-drilled microvia 330a.

Please refer briefly to FIG. 7, the region 3a' corresponding to the 4-ball pad unit area 3a in FIG. 6 accommodates only two laser-drilled microvias 330a and 430a and only one mechanically-drilled buried through via 630a that interconnects the power plane 610 in the second layer ($L_2$) with the underlying layers of the exemplary high-density multi-layer PCB.

According to the illustrative embodiment, each 4-ball pad unit area 3b includes only one ground ball pad 402, for example, ground ball pad 402g, and three power ball pads 302, for example, power ball pads 302f, 302g, and 302h. In the 4-ball pad unit area 3b, according to the illustrative embodiment, only two of the three power ball pads 302, for example, power ball pads 302f and 302g, are interconnected to the underlying ground plane 710 through respective laser-drilled microvias 330b and 330c. Please refer briefly to FIG. 7, the region 3b' corresponding to the 4-ball pad unit area 3b in FIG. 6 accommodates only two laser-drilled microvias 330b and 330c and only one mechanically-drilled buried through via 630b that interconnects the power plane 610 in the second layer ($L_2$) with the underlying layers of the exemplary high-density multi-layer PCB.

According to the illustrative embodiment, each 4-ball pad unit area 3c includes two power ball pads 302, for example, power ball pads 302i and 302j, and two ground ball pads 402, for example, ground ball pads 402e and 402f. In the 4-ball pad unit area 3c, according to the illustrative embodiment, only one of the two ground ball pads 402, for example, ground ball pad 402e, may be interconnected to the underlying ground plane 710 through the laser-drilled microvia 430b. In FIG. 7, the region 3c' corresponding to the 4-ball pad unit area 3c in FIG. 6 accommodates only one laser-drilled microvia 430b and only one mechanically-drilled buried through via 730a that interconnects the ground plane 710 in the second layer ($L_2$) with the underlying layers of the exemplary high-density multi-layer PCB.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A microelectronic system, comprising:
a base, comprising:
an internal conductive layer;
a build-up layer on the internal conductive layer, said build-up layer comprising a top conductive layer;

a plurality of microvias in the build-up layer to electrically connect the top conductive layer with the internal conductive layer; and a power/ground ball pad array in the top conductive layer, said power/ground ball pad array comprising power ball pads and ground ball pads arranged in an array with a fixed ball pad pitch P, and said power/ground ball pad array comprising a 4-ball pad unit area comprised of only one ground ball pad and three power ball pads, or comprised of only one power ball pad and three ground ball pads; and a semiconductor device mounted on the base.

2. The microelectronic system according to claim 1, wherein said 4-ball pad unit area has a rectangular shape and a dimension of about 2P×2P.

3. The microelectronic system according to claim 1 further comprising a solder mask on said build-up layer.

4. The microelectronic system according to claim 3, wherein said solder mask comprises a plurality of solder mask openings for exposing said power ball pads and said ground ball pads, respectively.

5. The microelectronic system according to claim 1, wherein said base comprises 2 to 8 internal conductive layers.

6. The microelectronic system according to claim 1, wherein said microvias are laser-drilled microvias and each of said microvias has a via diameter size ranging between 0.05-0.2 mm.

7. The microelectronic system according to claim 1, wherein said only one ground ball pad is a distal ground ball pad of a ground net.

8. The microelectronic system according to claim 1, wherein said only one power ball pad is a distal power ball pad of a power net.

9. A microelectronic system, comprising:
a base, comprising:
an internal conductive layer;
a build-up layer on the internal conductive layer, said build-up layer comprising a top conductive layer;
a plurality of microvias in the build-up layer to electrically connect the top conductive layer with the internal conductive layer;
a power net in the top conductive layer, said power net comprising a plurality of power ball pads arranged and interconnected in a comb-shaped pattern; and
a ground net disposed being in close proximity to said power net and coupled to said power net in an interdigitated fashion, wherein said ground net comprises a plurality of ground ball pads arranged and interconnected in an inverted comb-shaped pattern so that said ground net is interdigitated with said power net; and
a semiconductor device mounted on the base.

10. The microelectronic system according to claim 9, wherein said plurality of power ball pads and said plurality of ground ball pads are arranged in an array with a fixed ball pad pitch.

11. The microelectronic system according to claim 9, wherein said power ball pads are interconnected together by a first power trace and a second power trace.

12. The microelectronic system according to claim 11, wherein said first power trace extends along a first direction and said second power trace extends along a second direction, wherein said first direction is perpendicular to said second direction.

13. The microelectronic system according to claim 12, wherein four to six of said power ball pads are interconnected together along said first direction by said first power trace, and three of said power ball pads are interconnected together along said second direction by said second power trace.

14. The microelectronic system according to claim 12, wherein said ground ball pads are interconnected together by a first ground trace and a second ground trace.

15. The microelectronic system according to claim 14, wherein said first ground trace extends along said first direction and said second ground trace extends along said second direction.

16. The microelectronic system according to claim 15, wherein four to six of said ground ball pads are interconnected together along said first direction by said first ground trace, and three of said ground ball pads are interconnected together along said second direction by said second ground trace.

17. The microelectronic system according to claim 9, wherein said microvias are laser-drilled microvias and each of said microvias has a via diameter size ranging between 0.05-0.2 mm.

18. The microelectronic system according to claim 17, wherein said plurality of power ball pads and said plurality of ground ball pads are arranged in an array with a fixed ball pad pitch, and wherein said array comprises a 4-ball pad unit area that is comprised of only one ground ball pad and three power ball pads, or comprised of only one power ball pad and three ground ball pads.

19. The microelectronic system according to claim 18, wherein in said 4-ball pad unit area, only two of the three power ball pads are interconnected to an underlying power plane in said internal conductive layer through respective two of said microvias.

20. The microelectronic system according to claim 18, wherein in said 4-ball pad unit area, only two of the three ground ball pads are interconnected to an underlying ground plane in said internal conductive layer through respective two of said microvias.

21. A microelectronic system, comprising:
a base, comprising
an internal conductive layer;
a build-up layer on the internal conductive layer, said build-up layer comprising a top conductive layer;
a plurality of microvias in the build-up layer to electrically connect the top conductive layer with the internal conductive layer;
a power net in the top conductive layer, said power net comprising a plurality of power ball pads arranged in cascade; and
a ground net disposed being in close proximity to said power net and coupled to said power net in an interdigitated fashion, wherein said ground net comprises a plurality of ground ball pads arranged in cascade; and
a semiconductor device mounted on the base.

22. The microelectronic system according to claim 21, wherein said plurality of power ball pads and said plurality of ground ball pads are arranged in an array with a fixed ball pad pitch.

* * * * *